US005559816A

United States Patent [19]
Basting et al.

[11] Patent Number: 5,559,816
[45] Date of Patent: Sep. 24, 1996

[54] NARROW-BAND LASER APPARATUS

[75] Inventors: Dirk Basting, Gottingen; Jurgen Kleinschmidt, Weissenfels, both of Germany

[73] Assignee: Lambda Physik Gesellschaft Zur Herstellung Von Lasern mbH, Germany

[21] Appl. No.: 453,609

[22] Filed: May 30, 1995

[30] Foreign Application Priority Data

Oct. 26, 1994 [DE]  Germany ............... 44 38 283.9

[51] Int. Cl.[6] ................................................ H01S 3/10
[52] U.S. Cl. .................... 372/27; 372/98; 372/92; 372/106; 372/102
[58] Field of Search ............... 372/27, 92, 98, 372/106, 57, 102, 107, 108

[56] References Cited

U.S. PATENT DOCUMENTS

| | | | |
|---|---|---|---|
| 4,985,898 | 1/1991 | Furuya et al. | 372/106 |
| 5,150,370 | 9/1992 | Furuya et al. | 372/106 |
| 5,325,378 | 6/1994 | Zorabedian | 372/102 |

FOREIGN PATENT DOCUMENTS 4401131  1/1994  Germany.

OTHER PUBLICATIONS

H.-J. Sahlert, U. Rebban, P. Lokai & D. Basting "Comparison of 248 nm Line Narrowing Resonator Optics for Deep UV Lithography Lasers," *Optical/Laser Microlithography IV*, SPIE vol. 1463, 1991, pp. 604–609.

*Primary Examiner*—Leon Scott, Jr.
*Attorney, Agent, or Firm*—Limbach & Limbach L.L.P.

[57] ABSTRACT

A narrow-band laser apparatus comprises an optical resonator including first and second reflectors for reflecting radiation, a laser medium for amplifying radiation in said resonator and an etalon for selecting a given wavelength component from said radiation. A polarizing beam splitter is provided for linearly polarizing said radiation and also for acting as an output coupler. In order to obtain very narrow bandwidth radiation of high intensity, a Faraday rotator is provided for rotating the plane of polarization while maintaining the linear polarization thereby allowing a second wavelength selection element (such as a grating) to be efficiently employed to further narrow the output of the laser.

27 Claims, 2 Drawing Sheets

NARROW-BAND LASER APPARATUS

FIELD OF THE INVENTION

This invention relates to a narrow-band laser apparatus. In particular the invention relates to a narrow-band excimer laser apparatus.

In some laser applications, in particular when applying an excimer laser as a light source for photolithography, a very narrow bandwidth is required, namely a bandwidth around 0.001 nm or less.

DESCRIPTION OF THE PRIOR ART

In the scientific literature, a large number of arrangements are proposed for generating narrow bandwidth laser radiation, in particular in connection with excimer lasers, cf. SPIE, Vol. 1463; Optical/Laser Microlithographie IV (1991), p. 604.

For reducing the bandwidth within the laser resonator—different kinds of selection means are known in the art for selecting a given wavelength component from the radiation within the resonator. Such means are, in particular:

- a grating, usually combined with beam expanding optical means,
- prisms, and
- Fabry-Perot etalons.

These means for selecting a given wavelength and reducing the bandwidth of the radiation can be used separately or in combination.

When deciding which type of line narrowing optics are to be used, the specific attributes of each of the different optical elements should be considered. These attributes include the ability to reduce the bandwidth as well as the ability to withstand high energy radiation for long periods of time. With regard to these criteria it is appreciated in the art that an etalon, as compared to a grating and prisms, provides for a very efficient reduction of bandwidth. However, an etalon is susceptible to damage when subjected to high energy radiation. Gratings and prisms, on the other hand, while being less efficient than an etalon as a line narrowing element, are relatively robust (i.e. are stable over long periods of exposure to high energy light).

Recently issued U.S. Pat. No. 5,150,370, to Furuya discloses a laser system which utilizes an intracavity etalon as a line narrowing element. The exposure of the etalon to radiation, i.e. the radiation load on the etalon, is kept relatively low because a special technique is used for outputting radiation out of the optical resonator. In this technique, a quarter-wave plate (or an equivalent phase retarder) is used as a means for changing the ratio of P and S polarized components of the radiation within the resonator. When the quarter-wave plate is rotated around the axis of the light path, a light beam having both polarization components can be controlled such that a certain ratio between both polarization components can be set. A polarizing beam splitter which is utilized as an output coupling means, transmits a certain part of radiation out of the laser resonator, said part being dependent from the ratio between both polarization components (P and S polarization components).

The device shown in the latter patent is limited because the wavelength selection elements (e.g. an etalon, prisms, or a grating) can be operated efficiently only if they are positioned on one side of the laser medium, i.e. between the beam splitter and one total reflection mirror. In particular, an etalon cannot be positioned on the other side of the laser medium because of the high intensity of the radiation at that side. In addition, it is undesirable to use other wavelength selection elements (such as a grating or prism) in this region since light in this region of the resonator is elliptically polarized by the quarter-wave plate. More specifically, the grating or prism will tend to change the polarization state of elliptically polarized light, thereby reducing the efficiency of the system.

It is therefore an object of the subject invention to provide an improvement over the system described in the prior patent by allowing line narrowing optics to be effectively used on both sides of the gain medium.

SUMMARY OF THE INVENTION

The present invention has been developed in order to provide a narrow-band laser apparatus, in particular an excimer laser apparatus, which is capable of emitting radiation of very narrow bandwidth with high intensity.

The present invention provides a narrow-band laser apparatus comprising

- an optical resonator including first and second reflecting means for reflecting radiation within the resonator,
- a laser medium for amplifying radiation in said resonator,
- selection means in said resonator for selecting a given wavelength component from said radiation,
- polarizing means for polarizing said radiation in a plane of polarization,
- rotating means for rotating said plane of polarization, and
- means for outputting a part of said radiation out of said resonator in response to the direction of the rotated plane of polarization relative to said means for outputting.

The aforementioned rotating means for rotating the plane of polarization of radiation is distinguished over a quarter-wave plate or other phase retarders, as utilized in U.S. Pat. No. 5,150,370. As noted above, the quarter-wave plate used in the prior laser creates elliptically polarized light in the region between the plate and the end mirror. In contrast, in accordance with the present invention, a rotating means is employed which merely rotates the plane of polarization of the light while maintaining the linear polarization of the beam. In this manner, additional robust, but polarization sensitive, line narrowing elements (such as a grating) may be efficiently used in this region of the resonator.

Means for rotating a plane of polarization are known in the art. They are called Faraday rotators. A Faraday rotator comprises an optically isotropic material. A magnetic field is applied to the material. Depending on the optically effective length of the material through which the light beam is transmitted and the strength of the magnetic field, a linearly polarized light beam is affected by the Faraday rotator such that the plane of polarization is rotated by a certain angle. By changing the strength of the magnetic field that angle can be controlled.

It has turned out that quartz, and in particular fused silica, is very well suited for use as an optically isotropic material in a Faraday rotator for rotating a plane of polarization of a light beam in the ultraviolet range of the electromagnetic spectrum, in particular in the range of wavelengths emitted by an excimer laser and used e.g. for photolithography (193 nm to 353 nm).

According to a preferred embodiment of the present invention said means for outputting comprises a polarizing beam splitter having an incident plane and said part of radiation is outputted externally in response to the direction of said rotated plane of polarization relative to said incident plane of said polarizing beam splitter.

Another preferred embodiment of the present invention is characterized in that said resonator comprises between said laser medium and said first reflecting means a first selection means for selecting a given wavelength and between said laser medium and said second reflecting means a second selection means for further improving the selection of said given wavelength. Preferably an etalon is positioned in the light path of the resonator at one side of the laser medium whereas a grating, along with a beam expander, is positioned in the light path of the resonator at the other side of the laser medium. The grating serves, in addition to its function as a selection means, also as a mirror.

Another preferred embodiment of the invention comprises a resonator which includes at least two beam expanding means (like prisms) wherein the laser medium is arranged at such a position that an expanded light beam is transmitted through the laser medium. This arrangement has the advantage that the laser medium is effectively utilized for amplification. This is particularly important in connection with a gas discharge laser, like an excimer laser.

The laser apparatus according to the present invention has the further advantage that the means for rotating the plane of polarization can be controlled (e.g. by controlling the magnetic field strength) such that the angle by which the plane of polarization is rotated is such that the percentage of radiation being outputted externally is adjusted to an optimum value for the given laser apparatus. For example, if a polarizing beam splitter is utilized as a means for outputting, the percentage of radiation which is reflected by the beam splitter depends on the direction of the plane of polarization of the light beam incident at the beam splitter relative to the direction of the so-called incident plane of the beam splitter. Similar considerations apply to the percentage of radiation being transmitted through the beam splitter. Therefore, according to the present invention, the percentage of radiation being outputted externally can be optimized in a very simple and exact manner.

BRIEF DESCRIPTION OF THE DRAWINGS

The object and features of the present invention will become more readily apparent from the following detailed description taken in conjunction with the accompanying drawings in which.

Figure 1:
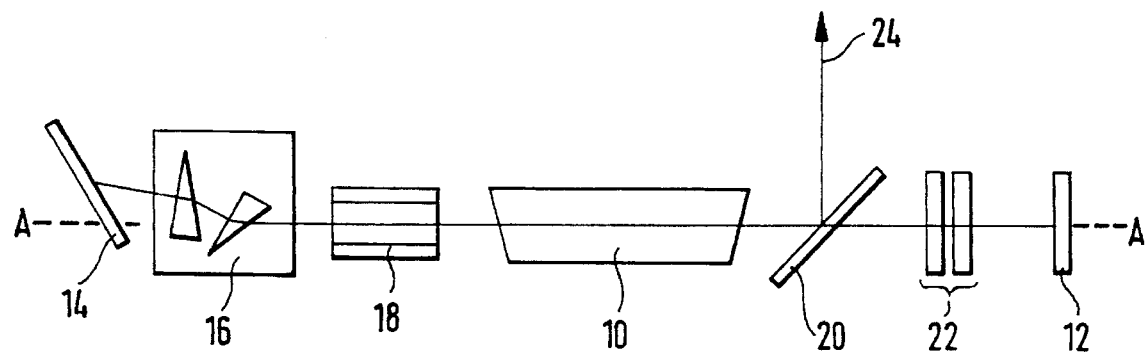
FIG. 1 is a schematic diagram of a first embodiment of a laser apparatus for generating narrow bandwidth radiation.

In the following, the invention is described in connection with excimer lasers.

In the drawings those parts and elements of the shown laser apparatuses having the same or an equivalent function are indicated by the same reference numerals.

In all figures, a laser medium 10, as is well-known in the art of excimer lasers, is generated in a laser tube by means of a gas discharge between electrodes (not shown). An optical resonator comprises total reflection mirrors 12 and 14. In the embodiment shown in FIG. 1, a total reflection mirror 14 is realized in the form of an optical grating. In the light path of the radiation circulating within the resonator an optical beam expander 16 is arranged in front of the grating 14. Such beam expanders are well-known in the art. They usually comprise prisms. The axis of the beam circulating in the resonator is indicated by "A".

A Faraday rotator 18 is interposed between the grating and beam expander 14, 16, on the one side, and the laser medium 10, on the other side. In between the laser medium 10 and the total reflection mirror 12 a polarizing beam splitter 20 and a Fabry-Perot etalon 22 are arranged, in the order shown in FIG. 1.

In the laser medium 10 (the plasma of the gas discharge) ultraviolet radiation is generated. The radiation which is emitted in direction of the total reflection mirror 12 is transmitted through the polarizing beam splitter 20. The beam splitter 20 is, in the shown embodiment, a thin-film polarizer. Different types of polarizing beam splitters are well-known in the art. For example, a multilayer cube polarizing element, a transparent plate of Brewster's angle, a Wollaston prism, etc. can also be used as a polarizing beam splitting element mentioned above. Preferably a polarizing beam split mirror is used.

The beam splitter 20 of the embodiment shown in FIG. 1 has a transmittance of 0.98 for the P-polarized component of the radiation, i.e. 98% of that P-polarized radiation is transmitted through the beam splitter 20. In the embodiment of FIG. 1, the plane of polarization of the P-polarized light is the plane of the drawing of FIG. 1. S-polarized radiation comprises a plane of polarization which is, in this embodiment, perpendicular to the plane of FIG. 1. Beam splitter 20 reflects 98% (or somewhat more) of the S-polarized radiation, i.e. 2% or less of the S-polarized light is transmitted through beam splitter 20. In other words, regarding the S-polarized radiation, the beam splitter 20 has a reflectivity of about 0.98 and a transmittance of about 0.02.

Therefore, the radiation transmitted through the polarizing beam splitter 20 is essentially P-polarized. This radiation is transmitted through the etalon 22 and is reflected at the mirror 12 and transmitted again through the etalon 22 so that the bandwidth of the radiation is narrowed with very high efficiency. This narrow bandwidth radiation is transmitted through the beam splitter 20 (from the right-hand side to the left-hand side in FIG. 1) without being attenuated considerably by the beam splitter and this radiation is then amplified by the laser medium 10. The amplified radiation is transmitted through the Faraday rotator 18 (from the right-hand side to the left-hand side in FIG. 1). The Faraday rotator 18 comprises quartz as an optically active and optically isotropic material.

In the preferred embodiment a Faraday rotator formed from fused silica (available under the tradename "Suprasil") can be used. Suprasil has proven to be a suitable material for a Faraday rotator capable of rotating a plane of polarization of UV-radiation. The Faraday rotator comprises means for generating a magnetic field penetrating the material. The magnetic field can be generated by a permanent magnet or by a solenoid. The Faraday rotator rotates the plane of polarization of the transmitted radiation by an angle α. The angle α depends on the strength of the applied magnetic field and the optically effective length of the pervious material. Therefore, with a given length of the rod, the angle α by which the plane of polarization is rotated can be controlled by varying the strength of the applied magnetic field.

The grating 14 together with the beam expander 16 comprises another wavelength selection element. In order to obtain a maximum reflectivity of the grating 14 the entire group of elements composed of the grating 14 and the beam expander 16 must be rotated with respect to the axis A such that its incident plane is parallel to the plane of polarization of the radiation. In the embodiment shown in FIG. 1 the plane of polarization of the radiation is rotated with respect to the plane of the paper by the angle $\alpha$ (cf. see above description of the Faraday rotator).

The radiation reflected by the grating 14 is transmitted again through the Faraday rotator (this time from the left-hand side to the right-hand side in FIG. 1) and is rotated again by an angle $\alpha$. Therefore, after being transmitted through the Faraday rotator twice, the plane of polarization of the radiation which is amplified by the laser medium 10 and which impinges on the beam splitter 20 is rotated by an angle $2\alpha$ with respect to the original plane of polarization (which is parallel to the plane of the drawing of FIG. 1).

Reflectivity R and transmittance T of the polarizing beam splitter 20 are determined by the angle $\alpha$. Reflectivity R is given by $R=\sin^2(2\alpha)$. Transmittance T is given by $T=\cos^2(2\alpha)$. In the embodiment shown in FIG. 1, the reflectivity R determines the percentage of the radiation impinging at the beam splitter 20 which is outputted externally as emitted laser radiation 24. With excimer lasers the optimum percentage of outputted radiation is typically 85% to 95% depending on the amplification per cycle and the internal losses within the resonator. This means that the above defined angle $\alpha$ is selected such that the reflectivity R of the beam splitter 20 is 0.85 to 0.95 with respect to the impinging polarized radiation. This means that the corresponding angle $\alpha$ is 34 degrees to 39 degrees.

Since the polarizing beam splitter 20 has a transmittance of only 0.05 to 0.15, the intensity (energy) of the radiation transmitted through the Fabry-Perot etalon 22 is relatively low, i.e. the intensity of the radiation on the right-hand side of the beam splitter 20 (FIG. 1) is by a factor of 6 to 20 times lower than on the left-hand side of beam splitter 20. Therefore, the light load of the etalon is reduced considerably.

From the above discussion of the rotation of the plane of polarization it follows that the polarizing beam splitter 20 of the embodiment shown in FIG. 1 is positioned such that its incident plane is not parallel to the incident plane of the grating 14 (including the beam expander 16). Rather, the beam splitter 20 is oriented along the axis A of the light path in the resonator such that its incident plane is offset by an angle $-\alpha$ with respect to the incident plane of the grating 14 and the beam expander 16 (the Faraday rotator rotates the plane of polarization by an angle $+\alpha$ per transmission).

In the embodiment of the invention shown in FIG. 1 the polarizing beam splitter 20 transmits the emitted radiation 24 by way of reflection at the beam splitter.

Figure 2:
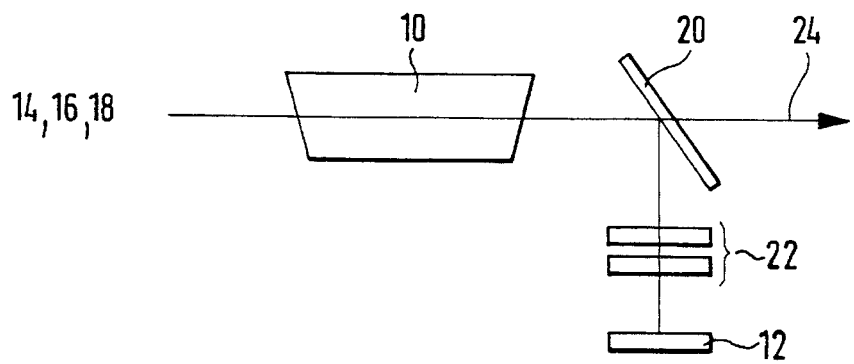
FIG. 2 is a second embodiment of a laser apparatus for generating narrow bandwidth radiation.

FIG. 2 shows another embodiment of the invention which corresponds to the embodiment according to FIG. 1 with the exception that the output light beam 24 is transmitted through the polarizing beam splitter 20. The radiation reflected by the polarizing beam splitter 20 is transmitted through the Fabry-Perot etalon 22 and reflected by the total reflection mirror 12 and after being transmitted again through the Fabry-Perot etalon 22 that radiation is reflected at the polarizing beam splitter 20 and transmitted through the laser medium 10. The Faraday rotator 18, the beam expander 16 and the grating 14 of the embodiment shown in FIG. 2 correspond exactly to the embodiment of FIG. 1. Therefore, these parts of the laser apparatus are not shown again in FIG. 2. They are indicated by reference numerals. The magnetic field of the Faraday rotator is adjusted such that the angle $\alpha$ by which the plane of polarization is rotated is such that the transmittance of polarizing beam splitter 20 (FIG. 2) is 0.85 to 0.95 and its reflectivity R is 0.05 to 0.15.

Figure 3:
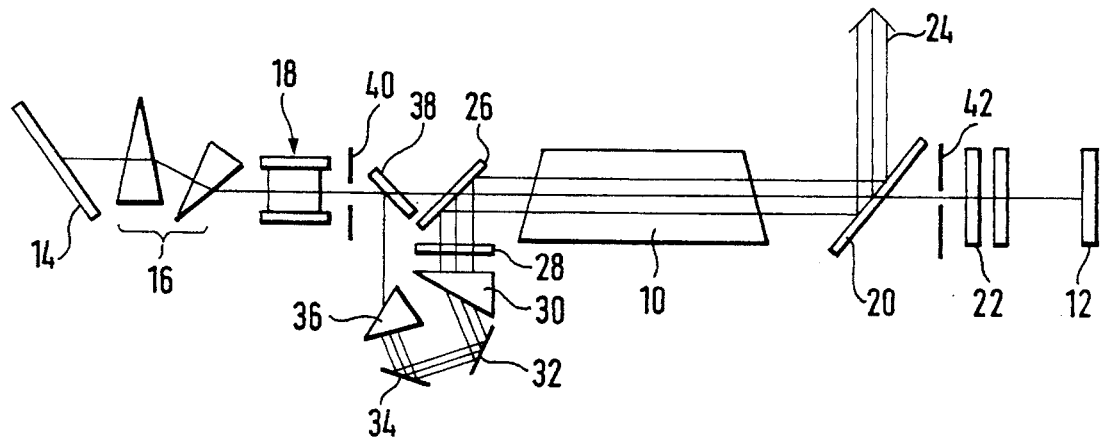
FIG. 3 is a third embodiment of a laser apparatus for generating narrow bandwidth radiation.

FIG. 3 shows a third embodiment of a narrow-band laser apparatus. This embodiment comprises two further polarizing beam splitters 26, 38 and a half-wave plate 28 and another beam expander which is composed of prisms 30, 36 and mirrors 32, 34. Furthermore, two slit-shaped diaphragms 40, 42 are arranged in the resonator.

The function of the laser apparatus shown in FIG. 3 is as follows: For further reducing the bandwidth of the radiation by means of the grating 14 and the beam expander 16 slit-shaped diaphragms 40, 42 are arranged within the resonator. Slit-shaped diaphragms 40, 42 also reduce the divergence of the beam. However, the slit-shaped diaphragms also reduce the diameter of the beam. If the beam transmitted through the laser medium 10 has a relatively small diameter, the laser medium (plasma of gas discharge) is not fully used for amplifying the radiation. Therefore, the laser apparatus according to FIG. 3 comprises the additional two polarizing beam splitters 38, 26 and the beam expander which is composed of prisms 30, 36 and mirrors 32, 34. The additional polarizing beam splitters 26, 38 are positioned in the light path such that its incident planes are parallel to the incident plane of the polarizing beam splitter 20. The half-wavelength plate 28 is selected such that the radiation after being transmitted through prisms 36, 30 and half-wavelength plate 28 (from the left-hand side to the right-hand side in FIG. 3) is S-polarized. The S-polarized radiation is fully reflected by the polarizing beam splitter 26. This reflected radiation is transmitted through the laser medium 10 with a relatively large beam diameter as shown in FIG. 3.

Figure 4:
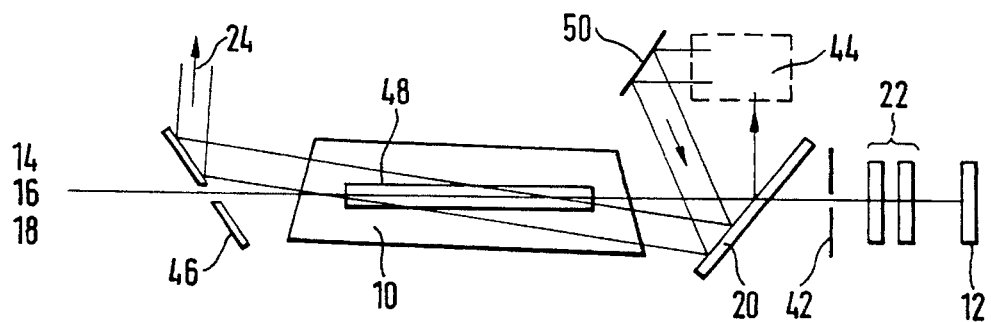
FIG. 4 is a fourth embodiment of a laser apparatus for generating narrow bandwidth radiation.

FIG. 4 shows a fourth embodiment of an excimer laser apparatus emitting narrow bandwidth radiation. It is known in the art to transmit the beam through the laser medium (plasma of gas discharge) such that the axis of the transmitted beam is not exactly parallel to the longitudinal axis of the electrodes of the excimer laser. This technique is preferably applied to transversely exited lasers.

FIG. 4 shows such an arrangement. The beam is tilted with respect to the longitudinal axis of the electrodes 48 of the excimer laser. In FIG. 4, the Faraday rotator 18, the beam expander 16 and the grating 14 are not shown. Rather, these parts are indicated by corresponding reference numerals. Regarding these elements the embodiment according to FIG. 4 is the same as the embodiment of FIG. 1.

The direction of the axis of the resonator is defined by slit shaped diaphragms 42, 46. This axis is tilted by about one degree relative to the longitudinal direction of the electrodes of the discharge tube of the excimer laser. Radiation reflected by the polarizing beam splitter is transmitted through a beam expander 44 (corresponding e.g. to the beam expander shown in FIG. 3, reference numerals 30, 32, 34, 36). The beam expanded by the expander 44 is reflected by the mirror 50 and impinges upon the polarizing beam splitter 20. Thereafter the beam is transmitted again through the laser medium 10, this time the direction of the beam is tilted by about two degrees relative to the longitudinal direction of the electrodes. A slit-shaped diaphragm 46 serves for generating the output beam 24. The surfaces of the diaphragm 46 are total reflection mirrors.

Figure 5:
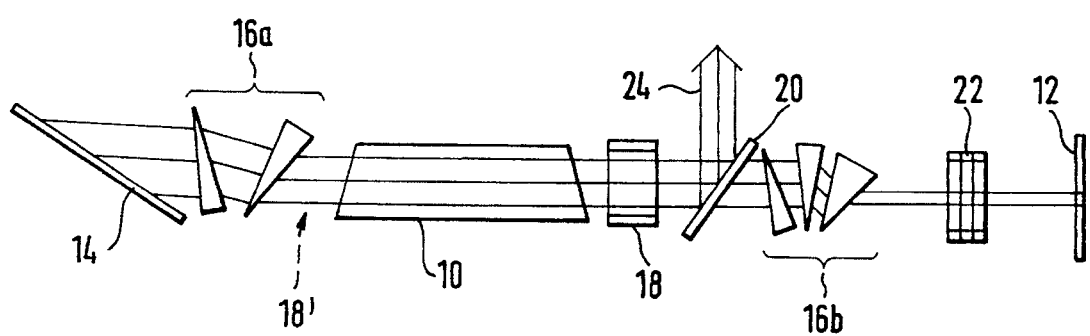
FIG. 5 is a fifth embodiment of a narrow bandwidth laser apparatus according to the invention.

FIG. 5 shows a fifth embodiment of a narrow bandwidth laser apparatus.

The embodiment according to FIG. 5 comprises two beam expanders 16a and 16b each being composed of a plurality of prisms. The laser medium 10 is interposed between the beam expanders 16a and 16b. Therefore, the beam transmitted through the laser medium 10 has a relatively large cross-section and, therefore, the laser medium 10 is utilized effectively for amplification of radiation. The other optical elements of FIG. 5 correspond to the embodiments shown in FIG. 1. The Faraday rotator 18 is interposed between the laser medium 10 and the polarizing beam splitter 20. The Faraday rotator 18 can alternatively be positioned between the laser medium 10 and the beam expander 16a which co-operates with the grating 14. That possible position of the Faraday rotator is indicated by the arrow 18

In this embodiment, it is desirable to align the optical axis of the prisms 16b with the plane of polarization of the beam to minimize reflection losses. One approach for achieving this goal would be to rotate the prisms by an angle α to match the rotation induced by the Faraday rotator. Since rotating the prisms can be cumbersome, another alternative can include inserting a half-wave plate (not shown) into the resonator between the splitter 20 and the prisms 16b. The half-wave plate functions to rotate the plane of polarization of the linearly polarized light passing through the splitter prior to striking the prisms. The azimuthal angle of the half-wave plate can be adjusted so that the rotation induced by the plate will compensate for the angle of rotation induced by the Faraday rotator. By this arrangement, the reflection losses on the prisms can be minimized without having to rotate the prisms.

We claim:

1. A narrow band laser apparatus comprising:
   a resonant cavity including a pair of reflective end mirrors;
   a gain medium located within said resonant cavity;
   means for exciting the gain medium to generate a laser beam;
   means for linearly polarizing the laser beam;
   first line narrowing means located between the polarizing means and one end mirror;
   means for controllably rotating the plane of polarization of the light beam while maintaining the linear polarization of the beam, said rotation means being located between said polarizing means and the ocher end mirror;
   means connected to the rotating means for independently varying the amount the rotation means rotates the plane of polarization of the laser beam; and
   means for coupling the laser beam out the cavity, with the percentage of the light beam that is coupled out of the cavity being a function of the amount the rotation means rotates the plane of polarization of the laser beam.

2. A laser as recited in claim 1 wherein said polarizing means and said coupling means are defined by a polarizing beam splitter.

3. A laser as recited in claim 1 wherein said first line narrowing means is an etalon.

4. A laser as recited in claim 1 wherein said means for rotating the plane of polarization is a Faraday rotator.

5. A laser as recited in claim 4 further including a second line narrowing means located between said Faraday rotator and the other end mirror.

6. A narrow-band laser apparatus according to claim 1 wherein said laser is an excimer laser.

7. A narrow-band laser apparatus according to claim 1, wherein said resonant cavity includes expanding means for expanding the width of said radiation.

8. A narrow-band laser apparatus according to claim 7, wherein said expanding means comprises prisms.

9. A narrow-band laser apparatus according to claim 1, wherein said resonant cavity includes first and second expanding means and wherein said gain medium is interposed between said first and second expanding means.

10. A narrow-band laser apparatus according to claim 9, wherein said expanding means comprise prisms.

11. A narrow-band laser apparatus according to claim 1, wherein said resonant cavity further includes two slit-shaped diaphragms, two polarizing beam splitters and an expanding optical means.

12. A narrow-band laser apparatus according to claim 11, wherein said two slit-shaped diaphragms define a resonator axis which is tilted relative to a longitudinal axis of said laser medium.

13. A narrow band laser apparatus comprising:
    a resonant cavity including a pair of reflective end mirrors;
    a gain medium located within said resonant cavity;
    means for exciting the gain medium to generate a laser beam;
    a polarizing beam splitter for linearly polarizing the laser beam;
    an etalon located between the beam splitter and one end mirror;
    a Faraday rotator for rotating the plane of polarization of the light beam while maintaining the linear polarization of the beam and located between said beam splitter and said other end mirror and wherein said beam splitter further functions to couple the laser beam out of the cavity, with the percentage of output coupling being a function of the amount the Faraday rotator rotates the plane of polarization of the laser beam; and
    a line narrowing means located between the faraday rotator and the other end mirror.

14. A narrow-band laser apparatus according to claim 13, wherein said laser is an excimer laser.

15. A narrow band laser apparatus comprising:
    a resonant cavity including a pair of reflective end mirrors;
    a gain medium located within said resonant cavity;
    means for exciting the gain medium to generate a laser beam;
    means for linearly polarizing the laser beam;
    first line narrowing means located between the polarizing means and one end mirror;
    means for rotating the plane of polarization of the light beam while maintaining the linear polarization of the beam, said rotation means being located between said polarizing means and the other end mirror;
    second line narrowing means located between said rotating means and the other end mirror, said second line narrowing means being of the type which requires substantially linear polarization interaction to avoid reducing the efficiency of the system; and
    means for coupling the laser beam out of the cavity, with the percentage of the light beam that is coupled out of the cavity being a function of the amount the rotation means rotates the plane of polarization of the laser beam.

16. A laser as recited in claim 15 wherein said polarizing means and said coupling means are defined by a polarizing beam splitter.

17. A laser as recited in claim 15 wherein said first line narrowing means is an etalon.

18. A laser as recited in claim 15 wherein said means for rotating the plane of polarization is a Faraday rotator.

19. A narrow-band laser apparatus according to claim 15 wherein said laser is an excimer laser.

20. A narrow-band laser apparatus as recited in claim 15 wherein said second line narrowing element is a grating.

21. A narrow-band laser apparatus as recited in claim 15 wherein said second line narrowing element is a prism.

22. A narrow-band laser apparatus according to claim 15, wherein said resonant cavity includes expanding means for expanding the width of said radiation.

23. A narrow-band laser apparatus according to claim 22, wherein said expanding means comprises prisms.

24. A narrow-band laser apparatus according to claim 15, wherein said resonant cavity includes first and second expanding means and wherein said gain medium is interposed between said first and second expanding means.

25. A narrow-band laser apparatus according to claim 24, wherein said expanding means comprise prisms.

26. A narrow-band laser apparatus according to claim 15, wherein said resonant cavity further includes two slit-shaped diaphragms, two polarizing beam splitters and an expanding optical means.

27. A narrow-band laser apparatus according to claim 26, wherein said two slit-shaped diaphragms define a resonator axis which is tilted relative to a longitudinal axis of said laser medium.

* * * * *